United States Patent
Kubota et al.

(10) Patent No.: US 12,532,686 B2
(45) Date of Patent: Jan. 20, 2026

(54) METHOD OF CLEANING SEMICONDUCTOR WAFER AND METHOD OF MANUFACTURING SEMICONDUCTOR WAFER

(71) Applicant: SUMCO Corporation, Tokyo (JP)

(72) Inventors: Mami Kubota, Tokyo (JP); Ryosuke Takahashi, Tokyo (JP); Sayaka Makise, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 236 days.

(21) Appl. No.: 18/578,884

(22) PCT Filed: Jun. 29, 2022

(86) PCT No.: PCT/JP2022/026089
§ 371 (c)(1),
(2) Date: Jan. 12, 2024

(87) PCT Pub. No.: WO2023/017691
PCT Pub. Date: Feb. 16, 2023

(65) Prior Publication Data
US 2024/0290665 A1    Aug. 29, 2024

(30) Foreign Application Priority Data
Aug. 12, 2021 (JP) ............... 2021-131785

(51) Int. Cl.
*H01L 21/02* (2006.01)
*G01N 13/02* (2006.01)
(Continued)

(52) U.S. Cl.
CPC ........ *H01L 21/02052* (2013.01); *G01N 13/02* (2013.01); *G01N 2013/0208* (2013.01);
(Continued)

(58) Field of Classification Search
CPC ................. G01N 2013/0208; G01N 13/02
See application file for complete search history.

(56) References Cited

U.S. PATENT DOCUMENTS 6,058,945 A * 5/2000 Fujiyama .......... H01L 21/02052
257/E21.216
2019/0242804 A1* 8/2019 Alshehri ................ G01N 33/24

FOREIGN PATENT DOCUMENTS

| JP | H09-321009 A | 12/1997 |
| JP | 2007-165366 A | 6/2007 |
| JP | 2015-220284 A | 12/2015 |

OTHER PUBLICATIONS

Good et al., The effect of drop size on contact angle, J. Colloid & Interface Sci. vol. 71 No. 2 (Academic Press 1979) (Year: 1979).*
(Continued)

*Primary Examiner* — Kaj K Olsen
*Assistant Examiner* — Richard Z. Zhang
(74) *Attorney, Agent, or Firm* — GREENBLUM & BERNSTEIN, P.L.C.

(57) ABSTRACT

This method of cleaning a semiconductor wafer can reliably reduce the LPD count on the wafer surface. The method includes a first step of measuring a contact angle of a surface of a semiconductor wafer under conditions in which a volume of a droplet dripped on the surface differs, a second step of calculating a ratio of change in a measured value of the contact angle to change in the volume of the droplet based on a relationship between the volume of the droplet and the measured value of the contact angle under the conditions, a third step of determining whether pretreatment is necessary for the semiconductor wafer surface based on the ratio, a fourth step of performing the pretreatment on the semiconductor wafer surface according to the determining in
(Continued)

the third step, and a fifth step of subsequently performing single-wafer spin cleaning on the semiconductor wafer surface.

19 Claims, 4 Drawing Sheets

(51) Int. Cl.
    *H01L 21/306*     (2006.01)
    *H01L 21/67*     (2006.01)

(52) U.S. Cl.
    CPC ...... *H01L 21/306* (2013.01); *H01L 21/67017* (2013.01); *H01L 21/67253* (2013.01)

(56) References Cited

OTHER PUBLICATIONS

Vafaei et al., Analysis of the relationship between liquid droplet size and contact angle, J. Colloid & Interface Sci. vol. 113 p. 133 (Elsevier 2005) (Year: 2005).*

ISR issued in International Patent Application No. PCT/JP2022/026089, Sep. 27, 2022, translation.

IPRP issued in International Patent Application No. PCT/JP2022/026089, Feb. 13, 2024, translation.

Office Action issued in TW Patent Application No. 111126985, May 2, 2023, translation.

* cited by examiner

METHOD OF CLEANING SEMICONDUCTOR WAFER AND METHOD OF MANUFACTURING SEMICONDUCTOR WAFER

TECHNICAL FIELD

The present disclosure relates to a method of cleaning a semiconductor wafer and a method of manufacturing a semiconductor wafer that include a step of performing single-wafer spin cleaning on the surface of a semiconductor wafer.

BACKGROUND

The manufacturing process for semiconductor wafers such as silicon wafers includes a cleaning step in which a cleaning solution is supplied onto the surface of a wafer, while the wafer is being rotated, to remove particles adhering to the surface (hereinafter also referred to as "single-wafer spin cleaning").

One example of single-wafer spin cleaning is a method in which spin cleaning with ozone water and spin cleaning with hydrofluoric acid are performed repeatedly. In this method, an oxide film is formed on the wafer surface by spin cleaning with ozone water. The oxide film, together with particles and the like on the wafer surface, is then removed by spin cleaning with hydrofluoric acid. Patent Literature (PTL) 1 discloses a method of cleaning wafers that includes a cleaning step using ozone water and a cleaning step using hydrofluoric acid. This method of cleaning wafers includes a spin cleaning step using pure water between the cleaning step using ozone water and the cleaning step using hydrofluoric acid.

CITATION LIST

Patent Literature

PTL 1: JP 2015-220284 A

SUMMARY

Technical Problem

In single-wafer spin cleaning, in order to effectively reduce light point defects (LPD) in the subsequent wafer inspection step, it is necessary to spread the cleaning solution evenly over the wafer surface to form a film of cleaning solution on the entire wafer surface. In this regard, a natural oxide film is formed on the wafer surface at the stage immediately before single-wafer spin cleaning, and the wafer surface is basically hydrophilic. The cleaning solution should therefore easily spread on the wafer surface in the initial step of single-wafer spin cleaning (for example, spin cleaning with ozone water). However, we have discovered that even under the same single-wafer spin cleaning conditions, a reduction in the LPD count is achieved in some wafers, whereas the reduction in the LPD count is insufficient in others.

To address this issue, it could be helpful to provide a method of cleaning a semiconductor wafer and a method of manufacturing a semiconductor wafer that can reliably reduce the LPD count on the wafer surface.

Solution to Problem

We examined how to resolve the aforementioned issue and made the following discoveries.

First, as described above, the wafer surface at the stage immediately before single-wafer spin cleaning is basically hydrophilic. Specifically, the contact angle of the wafer surface subjected to single-wafer spin cleaning is generally around 5° when measured by dripping pure water. However, we suspect the following.

In practice, the level of hydrophilicity of the wafer surface ends up varying, while not exhibiting a difference in the contact angle value of the wafer surface measured with pure water, depending on the storage conditions of the wafer before it is subjected to single-wafer spin cleaning.

In the initial step of single-wafer spin cleaning (for example, spin cleaning with ozone water) of a wafer with a degraded level of hydrophilicity, the cleaning solution does not spread evenly over the wafer surface, and the film of cleaning solution is not continuously maintained on the wafer surface. This results in local areas of the wafer surface that the cleaning solution does not reach.

As a result, particles remain after single-wafer spin cleaning, or etching irregularities occur after single-wafer spin cleaning, resulting in a higher LPD count.

We therefore performed a test as follows.

The contact angle of various wafer surfaces before single-wafer spin cleaning were measured by dripping an aqueous solution having a surface tension greater than the surface tension of pure water and measuring under a plurality of conditions in which the volume of the droplet differed.

Single-wafer spin cleaning was then performed on each wafer under the same conditions.

The LPD count on the wafer surface was then measured.

The reason for this approach is that if the contact angle of the wafer surface is measured with an aqueous solution having a larger surface tension than the surface tension of pure water, a larger measurement value of the contact angle can be obtained than when measuring the contact angle with pure water. We thus thought this would enable detection of differences in the severe hydrophilicity level of the wafer surface that cannot be detected by contact angle measurement with pure water. As a result of the aforementioned test, we discovered the following.

Wafers with a small ratio of change in contact angle to change in droplet volume have a lower LPD count.

Wafers with a high ratio of change in contact angle to change in droplet volume have a higher LPD count.

We thus discovered that, based on these ratios, it can be determined whether pretreatment to increase the hydrophilicity of the wafer surface is necessary prior to single-wafer spin cleaning, and in a case in which pretreatment is determined to be necessary, single-wafer spin cleaning can be performed after pretreatment to reliably reduce the LPD count on the wafer surface.

The primary features of the present disclosure, completed on the basis of these discoveries, are as follows.

[1] A method of cleaning a semiconductor wafer, the method including:

a first step of measuring a contact angle of a surface of a semiconductor wafer under a plurality of conditions in which a volume of a droplet dripped on the surface differs;

a second step of, based on a relationship between the volumes of the droplet and measured values of the contact angle under the plurality of conditions, calculating a ratio of change in the measured values of the contact angle to change in the volumes of the droplet;

a third step of determining whether pretreatment is necessary for the surface of the semiconductor wafer based on the ratio;

a fourth step of performing the pretreatment on the surface of the semiconductor wafer according to the determining in the third step; and a fifth step of subsequently performing single-wafer spin cleaning on the surface of the semiconductor wafer.

[2] The method of cleaning a semiconductor wafer according to [1], wherein after the first step and before the second step, a relative value of each of the measured values of the contact angle under the plurality of conditions is calculated, and in the second step, based on a relationship between the volumes of the droplet and the relative values of the measured values of the contact angle under the plurality of conditions, a ratio of change in the relative values of the measured values of the contact angle to change in the volumes of the droplet is calculated.

[3] The method of cleaning a semiconductor wafer according to [2], wherein each of the relative values is a value standardized based on the measured value of the contact angle under any one condition among the plurality of conditions.

[4] The method of cleaning a semiconductor wafer according to [3], wherein the any one condition is a condition that maximizes the measured value of the contact angle.

[5] The method of cleaning a semiconductor wafer according to any one of [1] to [4], wherein in the second step, a slope of a line obtained by applying a least squares method to the relationship is used as the ratio.

[6] The method of cleaning a semiconductor wafer according to any one of [1] to [5], wherein the plurality of conditions includes 3 or more conditions.

[7] The method of cleaning a semiconductor wafer according to any one of [1] to [6], wherein in the first step, an image of the droplet dripped on the surface of the semiconductor wafer is acquired, and in addition to the contact angle, the volume of the droplet is also measured from the image.

[8] The method of cleaning a semiconductor wafer according to any one of [1] to [7], wherein the droplet is composed of an aqueous solution having a surface tension greater than a surface tension of pure water.

[9] The method of cleaning a semiconductor wafer according to [8], wherein the aqueous solution is at least one selected from the group consisting of a sodium chloride solution, a potassium chloride solution, and a magnesium chloride solution.

[10] The method of cleaning a semiconductor wafer according to [9], wherein the aqueous solution has a concentration of 10 mass % or more.

[11] The method of cleaning a semiconductor wafer according to any one of [1] to [10], wherein the volume of the droplet is set within a range of 0.3 µL to 3.0 µL.

[12] The method of cleaning a semiconductor wafer according to any one of [1] to [11], wherein in the third step, it is determined that the pretreatment is unnecessary in a case in which an absolute value of the ratio is equal to or less than a predetermined threshold, and it is determined that the pretreatment is necessary in a case in which the absolute value of the ratio exceeds the threshold.

[13] The method of cleaning a semiconductor wafer according to [12], wherein the predetermined threshold is 0.050.

[14] The method of cleaning a semiconductor wafer according to [12], wherein the predetermined threshold is 0.020.

[15] The method of cleaning a semiconductor wafer according to any one of [1] to [14], wherein the pretreatment includes one or more of (i) immersing the semiconductor wafer in ozone water, (ii) exposing the surface of the semiconductor wafer to downflow in a clean room, and (iii) irradiating the surface of the semiconductor wafer with infrared light.

[16] The method of cleaning a semiconductor wafer according to any one of [1] to [15], wherein in a case of performing the pretreatment in the fourth step, the first step through the third step are repeated thereafter, and the fifth step is performed after it is determined that the pretreatment is not necessary again.

[17] The method of cleaning a semiconductor wafer according to any one of [1] to [16], wherein in the fifth step, spin cleaning with ozone water is performed first, followed by one or more sets of a combination of spin cleaning with hydrofluoric acid and subsequent spin cleaning with ozone water.

[18] The method of cleaning a semiconductor wafer according to any one of [1] to [17], wherein the semiconductor wafer is a silicon wafer.

[19] A method of manufacturing a semiconductor wafer, the method including the method of cleaning a semiconductor wafer according to any one of [1] to [18].

Advantageous Effect

According to the method of cleaning a semiconductor wafer and the method of manufacturing a semiconductor wafer of the present disclosure, the LPD count on the wafer surface can be reliably reduced.

DETAILED DESCRIPTION (Method of Cleaning Semiconductor Wafer)

A method of cleaning a semiconductor wafer of the present disclosure includes a first step of measuring a contact angle of a surface of a semiconductor wafer under a plurality of conditions in which a volume of a droplet dripped on the surface differs, a second step of, based on a relationship between the volumes of the droplet and measured values of the contact angle under the plurality of conditions, calculating a ratio of change in the measured values of the contact angle to change in the volumes of the droplet, a third step of determining whether pretreatment is necessary for the surface of the semiconductor wafer based on the ratio, a fourth step of performing the pretreatment on the surface of the semiconductor wafer according to the determining in the third step, and a fifth step of subsequently performing single-wafer spin cleaning on the surface of the semiconductor wafer.

After the first step and before the second step, a relative value of each of the measured values of the contact angle under the plurality of conditions is preferably calculated, and in the second step, based on a relationship between the volumes of the droplet and the relative values of the measured values of the contact angle under the plurality of conditions, a ratio of change in the relative values of the measured values of the contact angle to change in the volumes of the droplet is preferably calculated. Each of the relative values is preferably a value standardized based on the measured value of the contact angle under any one condition among the plurality of conditions.

Figure 1:
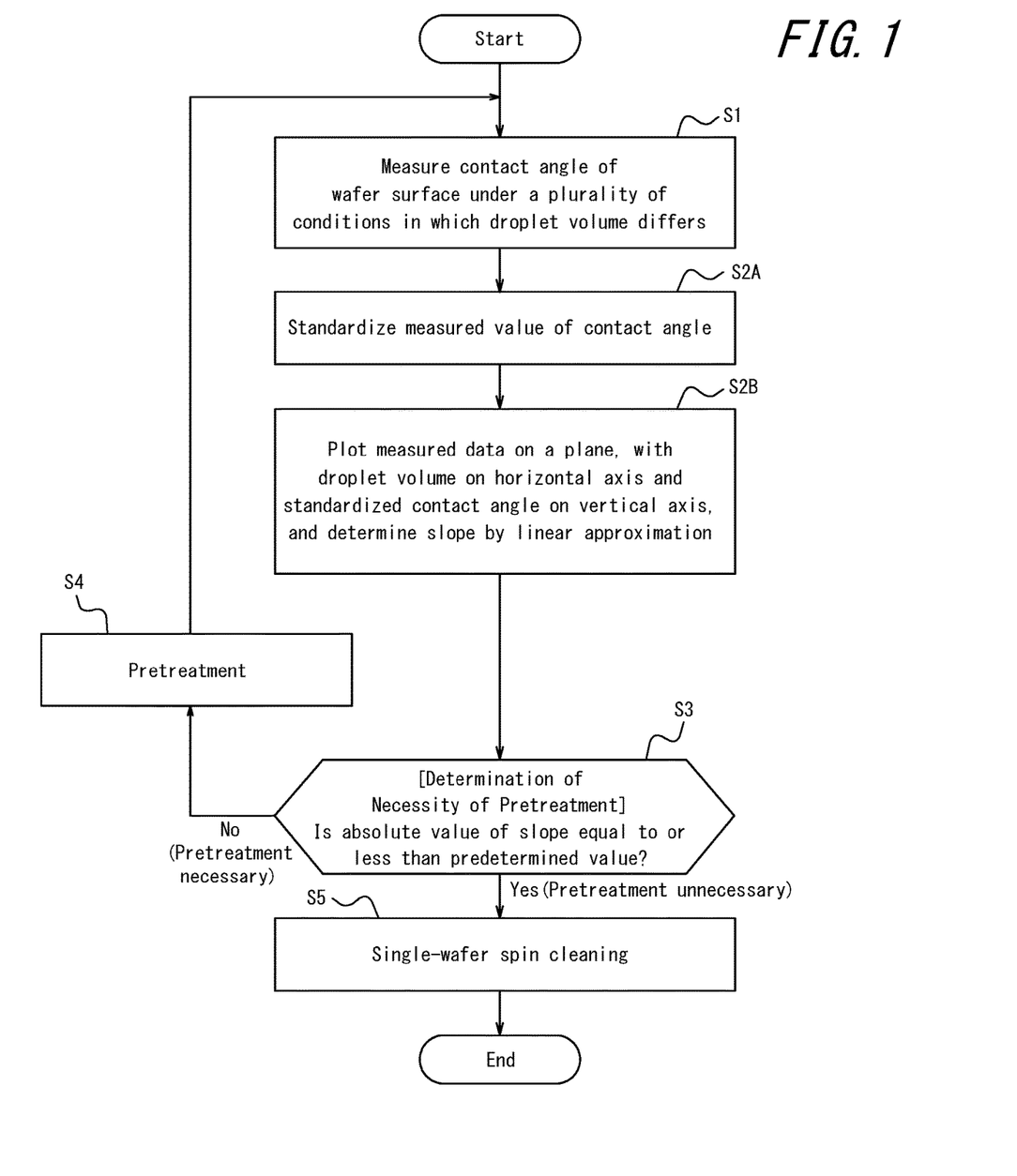
FIG. 1 is a flowchart illustrating a method of cleaning a semiconductor wafer according to an embodiment of the present disclosure.

A method of cleaning a semiconductor wafer according to an embodiment of the present disclosure includes, with reference to FIG. 1:

- a first step (step S1) of measuring a contact angle of a surface of a semiconductor wafer under a plurality of conditions in which a volume of a droplet dripped on the surface differs,
- a step (step S2A) of calculating a relative value of each of the measured values of the contact angle under the plurality of conditions by standardizing the measured values of the contact angle under the plurality of conditions based on the measured value of the contact angle under any one condition among the plurality of conditions,
- a second step (step S2B) of, by plotting the measured data on a plane with the droplet volume on the horizontal axis and the standardized contact angle on the vertical axis and determining the slope by linear approximation, calculating a ratio of change in the relative values of the measured values of the contact angle to change in the volumes of the droplet,
- a third step (step S3) of determining whether pretreatment is necessary for the surface of the semiconductor wafer based on the ratio,
- a fourth step (step S4) of performing the pretreatment on the surface of the semiconductor wafer in a case in which it is determined in step S3 that pretreatment is necessary,
- a step of returning again to step S1 after step S4, and
- a fifth step (step S5) of performing single-wafer spin cleaning on the surface of the semiconductor wafer in a case in which it is determined in step S3 that pretreatment is unnecessary.

The method of cleaning a semiconductor wafer according to the present disclosure and an embodiment of the present disclosure is characterized by the determination of the need for pretreatment before single-wafer spin cleaning, thereby reliably reducing the LPD count on the wafer surface. Details on each step are provided below.

[Semiconductor Wafer]

The semiconductor wafers subjected to the method of cleaning a semiconductor wafer according to the present disclosure and an embodiment of the present disclosure are not particularly limited but are suitably silicon wafers, particularly suitably single crystal silicon wafers.

Generally, the step immediately preceding single-wafer spin cleaning is a pre-cleaning step or an inspection step that follows the pre-cleaning step, and at the end of the pre-cleaning step, a natural oxide film is formed on the wafer surface. Specifically, in the pre-cleaning step, wafers are cleaned using a combination of an SC1 cleaning tank, an HF tank, an ozone tank, and the like and are then rinsed with pure water and subsequently dried. In the case of performing an inspection step, the wafer surface is inspected for particles, scratches, and the like, the wafer shape (flatness) is inspected, and so forth. In other words, the surface of the semiconductor wafer to be subjected to the method of cleaning a semiconductor wafer according to the present disclosure and an embodiment of the present disclosure has a natural oxide film formed thereon, and the wafer surface is basically hydrophilic. Specifically, the contact angle of the wafer surface is generally around 5° when measured by dripping pure water.

In practice, however, the level of hydrophilicity of the wafer surface varies, while not exhibiting a difference in the contact angle value of the wafer surface measured with pure water, depending on the storage conditions of the wafer before it is subjected to single-wafer spin cleaning. For example, after the aforementioned pre-cleaning step and optional inspection step, wafers are stored in a container called a Front-Opening Unified Pod (FOUP), and as the storage period becomes longer, minor deposition of organic matter may occur on the wafer surface. In addition, if drying after the aforementioned pre-cleaning step is insufficient, water vapor may be generated in the FOUP and adsorbed on the wafer surface, resulting in polarization of water molecules on the wafer surface. In the initial step of single-wafer spin cleaning (for example, spin cleaning with ozone water) of a wafer with such a severely degraded level of hydrophilicity, the cleaning solution does not spread evenly over the wafer surface, and the film of cleaning solution is not continuously maintained on the wafer surface, yielding local areas of the wafer surface that the cleaning solution does not reach. As a result, particles remain after single-wafer spin cleaning or etching irregularities occur after single-wafer spin cleaning, resulting in a higher LPD count. Therefore, for wafers with such a severely degraded level of hydrophilicity, pretreatment to increase the hydrophilicity of the wafer surface is performed prior to single-wafer spin cleaning. The method of cleaning a semiconductor wafer according to the present disclosure and an embodiment of the present disclosure is characterized by the determination of the need for this pretreatment and can reliably reduce the LPD count on the wafer surface.

[First Step (Step S1)]

First, in the first step (step S1), the contact angle of the surface of a semiconductor wafer is measured under a plurality of conditions in which the volume of a droplet dripped on the surface differs.

In the present embodiment, the contact angle is preferably measured by dripping a droplet composed of an aqueous solution having a surface tension greater than the surface tension of pure water onto the wafer surface. This enables detection of differences in the severe hydrophilicity level of the wafer surface that cannot be detected by contact angle measurement with pure water. Such an aqueous solution is preferably at least one selected from the group consisting of a sodium chloride solution, a potassium chloride solution, and a magnesium chloride solution. This is because these aqueous solutions are easy to prepare and have an appropriate surface tension. The concentration of these aqueous solutions is not particularly limited, but from the viewpoint of achieving an appropriate surface tension, the concentration is preferably 10 mass % or more, with a concentration up to the solubility being tolerable as an upper limit.

The volume of the droplet during contact angle measurement is preferably set within a range of 0.3 µL to 3.0 µL. The reason is that if the droplet volume is 0.3 μL or more, the effect of evaporation and volatilization of the droplet is small, and the error in contact angle measurement does not become large, while if the droplet volume is 3.0 μL or less, the droplet is not easily crushed by its own weight, and again the error in contact angle measurement does not become large.

From the viewpoint of accurately determining the need for pretreatment, the contact angle is preferably measured under 3 or more conditions in which the volume of the droplet differs, and more preferably under 5 or more conditions. Although no particular upper limit is placed on the number of conditions, the number of conditions can be 8 or less given that the determination accuracy becomes saturated.

In the first step, an image of the droplet on the surface of the semiconductor wafer is acquired, and the contact angle is measured from this image. The contact angle can be measured by a standard method. For example, the θ/2 method, tangential method, or curve fitting method can be used.

In the first step, the volume (amount) of the actually dripped droplet is preferably measured (calculated) from the aforementioned image. Although the droplet volume can be set on the contact angle meter that is used, some degree of error may occur between the device setting of the droplet volume and the actual volume of the droplet that is dripped. For example, see the variation in the position on the horizontal axis of the plot in FIG. 3. Therefore, a more accurate determination can be made by applying the actual measured droplet volume, rather than the device setting, from the next step onward.

[Standardization Step (Step S2A)]

Next, the relative values of the measured values of the contact angle under the plurality of conditions are obtained. The method of obtaining the relative values is not particularly limited, but for example, as in step S2A, a method of standardizing the measured values of the contact angle under the plurality of conditions, based on the measured value of the contact angle under any one of the plurality of conditions, can be suitably employed. At this time, the condition serving as a basis is not particularly limited, but for example, the condition that maximizes the measured value of the contact angle can be used as a basis.

[Second Step (Step S2B)]

Next, in the second step, based on a relationship between the volumes of the droplet and the relative values of the measured values of the contact angle under the plurality of conditions, a ratio of change in the relative values of the measured values of the contact angle to change in the volumes of the droplet is calculated. The method of calculating the ratio is not particularly limited, but the slope of a line obtained by applying the least squares method to the relationship can be used as the ratio. In other words, in step S2B of the present embodiment, the measured data is plotted on a plane with the droplet volume on the horizontal axis and the standardized contact angle on the vertical axis, and the slope is determined by linear approximation. The least squares method can be employed as a method of linear approximation. For example, see FIG. 3.

[Third Step (Step S3)]

Next, in the third step (step S3), it is determined whether pretreatment is necessary for the surface of the semiconductor wafer based on the ratio. As described above, we discovered after study that wafers with a small ratio of change in contact angle to change in droplet volume have a lower LPD count, whereas wafers with a high ratio of change in contact angle to change in droplet volume have a higher LPD count. Therefore, in the third step, it is determined that the pretreatment is unnecessary in a case in which the absolute value of the ratio is equal to or less than a predetermined threshold, and it is determined that the pretreatment is necessary in a case in which the absolute value of the ratio exceeds the predetermined threshold.

Since the predetermined threshold varies depending on the conditions of single-wafer spin cleaning, such as the type of cleaning solution, the flow rate of the cleaning solution, and the wafer rotation speed, an appropriate value for each single-wafer spin cleaning condition is preferably determined in advance. As an example, the predetermined threshold can be set to 0.050, or the predetermined threshold can be set to 0.020.

[Fourth Step (Step S4)]

In the fourth step (step S4), pretreatment is performed on the surface of the semiconductor wafer in a case in which it is determined in step S3 that pretreatment is necessary. Pretreatment is not performed in a case in which it is determined in step S3 that pretreatment is unnecessary. Pretreatment is a process to increase the hydrophilicity of the wafer surface. For example, in a case in which minor deposition of organic matter is thought to have occurred on the wafer surface, (i) the semiconductor wafer can be pretreated by immersion in ozone water to remove the organic matter. In a case in which polarization of water molecules is believed to have occurred on the wafer surface, at least one of the following pretreatments can be performed to control the orientation of the water molecules on the wafer surface: (ii) pretreatment to expose the surface of the semiconductor wafer to downflow in a clean room, and (iii) pretreatment to irradiate the surface of the semiconductor wafer with infrared light. As the pretreatment, one or more of the (i) through (iii) above can be performed as appropriate.

With regard to the conditions on pretreatment to immerse the semiconductor wafer in ozone water, the concentration of the ozone water is preferably in a range of 20 mg/L to 30 mg/L, and the immersion time in ozone water is preferably in a range of 5 seconds to 300 seconds, more preferably in a range of 60 seconds to 300 seconds. The single-wafer spin cleaning is also more preferably performed immediately after immersion in the ozone tank.

The conditions for pretreatment to expose the surface of the semiconductor wafer to downflow in a clean room preferably include placing the semiconductor wafer under a fan in a clean room in an atmosphere at a room temperature of 20° C. to 25° C. and humidity of 30% to 50% and exposing the surface of the semiconductor wafer to the downflow formed by the circulation of this atmosphere. The fan speed is preferably in a range of 1000 rpm to 2000 rpm, and the standby time under the downflow is preferably in a range of 60 seconds to 1200 seconds, more preferably in a range of 180 seconds to 1200 seconds. Ionizers are preferably not used.

The conditions for pretreatment to irradiate the surface of the semiconductor wafer with infrared light preferably include irradiating the surface of the semiconductor wafer with infrared light having a wavelength of approximately 0.5 μm to 35 μm for 200 seconds to 1800 seconds. The wafer temperature during irradiation is preferably in a range of 50° C. to 80° C.

[Fifth Step (Step S5)]

In the fifth step (step S5), single-wafer spin cleaning is performed on the surface of the semiconductor wafer in a case in which it is determined in step S3 that pretreatment is unnecessary. In the fifth step, spin cleaning with ozone water is preferably performed first, followed by one or more sets of a combination of spin cleaning with hydrofluoric acid and subsequent spin cleaning with ozone water. In this method, an oxide film is formed on the wafer surface by spin cleaning with ozone water. The oxide film, together with particles and the like on the wafer surface, is then removed by spin cleaning with hydrofluoric acid. Since the last cleaning step is spin cleaning with ozone water, an oxide film is formed on the wafer surface after single-wafer spin cleaning. One or more sets of the combination that includes spin cleaning with ozone water can be performed, but the number of sets is suitably 1 to 5.

In the spin cleaning with ozone water, the concentration of the ozone water is not particularly limited as long as an oxide film is formed on the wafer surface, but the concentration can be 20 mg/L to 30 mg/L. The flow rate of ozone water is not limited as long as an oxide film is formed on the wafer surface, but the flow rate can be 0.5 L/min to 1.5 L/min. The process time per spin cleaning with ozone water is also not particularly limited as long as an oxide film is formed on the wafer surface, but the process time can be 50 seconds to 200 seconds.

In spin cleaning with hydrofluoric acid, the concentration of hydrofluoric acid can be set according to the contamination level of the wafers and is not particularly limited, but the concentration can be 0.5 mass % to 3.0 mass %. The flow rate of hydrofluoric acid can be set according to the contamination level of the wafers and is not particularly limited, but the flow rate can be 0.5 L/min to 1.5 L/min. The process time per spin cleaning with hydrofluoric acid can also be set according to the contamination level of the wafers and is not particularly limited, but the process time can be 50 seconds to 200 seconds.

The wafer rotation speed in each cleaning step is not particularly limited but can be 50 rpm to 800 rpm.

After single-wafer spin cleaning, spin drying, in which the wafer is continuously rotated without a supply of cleaning solution, is preferably preformed to remove the cleaning solution from the wafer surface and dry the wafer surface. The wafer rotation speed at this time is also not particularly limited but can be 1000 rpm to 1500 rpm.

As illustrated in FIG. 1, in a case in which pretreatment is performed in the fourth step, it is preferable then to return to step S1, to repeat step S1, step S2A, step S2B, and step S3, and to perform the fifth step of single-wafer spin cleaning after it is determined in step S3 that the pretreatment is not necessary again. Wafers with a reduced LPD count can thus more reliably be obtained.

However, this configuration is not essential. After pretreatment in the fourth step, the flow may transition directly to step S5, without returning to step S1, and single-wafer spin cleaning may be performed. For example, in a case in which adopted pretreatment conditions are such that the wafer surface is expected to be sufficiently hydrophilic, it is preferable to perform single-wafer spin cleaning directly after pretreatment in the fourth step to simplify the overall procedure.

Other Embodiments

In the embodiment illustrated in FIG. 1, the relative values obtained by standardizing the measured values of the contact angle under the plurality of conditions were calculated in step S2A, but this step is not essential. Step S2A may be omitted, and in step S2B, the ratio of change in the measured value of the contact angle to change in the volume of the droplet may be calculated based on the relationship between the droplet volume and the measured value of the contact angle under the plurality of conditions. However, in the case of not standardizing, the absolute value of the contact angle may change depending on the measurement environment (temperature, humidity, droplet concentration, and the like). Step S2A (standardization step) is preferably performed, since the standardized contact angle is a quantitative index that is independent of the measurement environment.

It is not necessary to apply the method of cleaning a semiconductor wafer according to the present disclosure and an embodiment of the present disclosure (i.e., contact angle measurement and the determination of whether pretreatment is necessary) to all of the semiconductor wafers that are to pass through the manufacturing process. For example, among a plurality of semiconductor wafers that have the same storage conditions (temperature, humidity, storage time, and the like) after the pretreatment step until being subjected to single-wafer spin cleaning, the method of cleaning a semiconductor wafer according to the present disclosure and an embodiment of the present disclosure can be applied to at least one semiconductor wafer to determine whether pretreatment is necessary. The pretreatment can then be performed or omitted for the remaining semiconductor wafers, according to the result of the determination, before performing single-wafer spin cleaning.

(Method of Manufacturing Semiconductor Wafer)

A method of manufacturing a semiconductor wafer according to an embodiment of the present disclosure includes the aforementioned method of cleaning a semiconductor wafer. Wafers with a reduced LPD count can thus reliably be manufactured. A method of manufacturing a semiconductor wafer according to the present embodiment may, for example, include:

- a step of obtaining a single crystal ingot by the Czochralski method,
- a step of slicing this single crystal ingot to obtain a plurality of wafers,
- a planarization step of lapping and grinding the wafers,
- a polishing step of performing double-sided polishing and subsequent single-sided finish polishing of the wafers,
- a pre-cleaning step of cleaning the wafers using a combination of an SC1 cleaning tank, an HF tank, an ozone tank, and the like and then rinsing the wafers with pure water and subsequently drying the wafers,
- a subsequent optional inspection step,
- the method of cleaning a semiconductor wafer according to the present embodiment, including contact angle measurement and single-wafer spin cleaning, and
- a final inspection step including measuring the LPD count on the surface of the wafers.

EXAMPLES

Experimental examples that led to the completion of the present disclosure are described below.

Experimental Example 1

After mirror polishing, wafers were subjected to a pre-cleaning step of cleaning the wafers using a combination of an SC1 cleaning tank, an HF tank, an ozone tank, and the like and then rinsing the wafers with pure water and subsequently drying the wafers. The wafers were then stored under different storage conditions. Three single crystal silicon wafers (300 mm diameter) were thus prepared.

The contact angle of the surface of each silicon wafer was measured by the θ/2 method under the following conditions.
Apparatus: PCA-11 portable contact angle meter manufactured by Kyowa Interface Science Co., Ltd.
Type of dripped liquid: pure water
Set droplet volume: 1 μL
Measurement points: 25 points on wafer surface For each silicon wafer, single-wafer spin cleaning was performed by first performing spin cleaning with ozone water, followed by 3 sets of a combination of spin cleaning with hydrofluoric acid and subsequent spin cleaning with ozone water. Finally, spin drying was performed at a wafer rotation speed of 1500 rpm.
Conditions for spin cleaning with ozone water
    Concentration: 25 mg/L
    Flow rate: 1.0 L/min
    Process time per cleaning: 200 seconds
    Wafer rotation speed: 500 rpm
Conditions for single-wafer spin cleaning with hydrofluoric acid
    Concentration: 1 mass %
    Flow rate: 1.0 L/min
    Process time per cleaning: 50 seconds
    Wafer rotation speed: 500 rpm The surface of each silicon wafer was then measured using a laser particle counter (manufactured by KLA-Tencor, Surfscan SP7) in high sensitivity (HS) mode to determine the number of LPDs 15 nm or greater in size. The LPD counts for the 3 silicon wafers were respectively over 100 (200), over 10 and equal to or less than 100 (32), and equal to or less than 10 (5).

Figure 2:
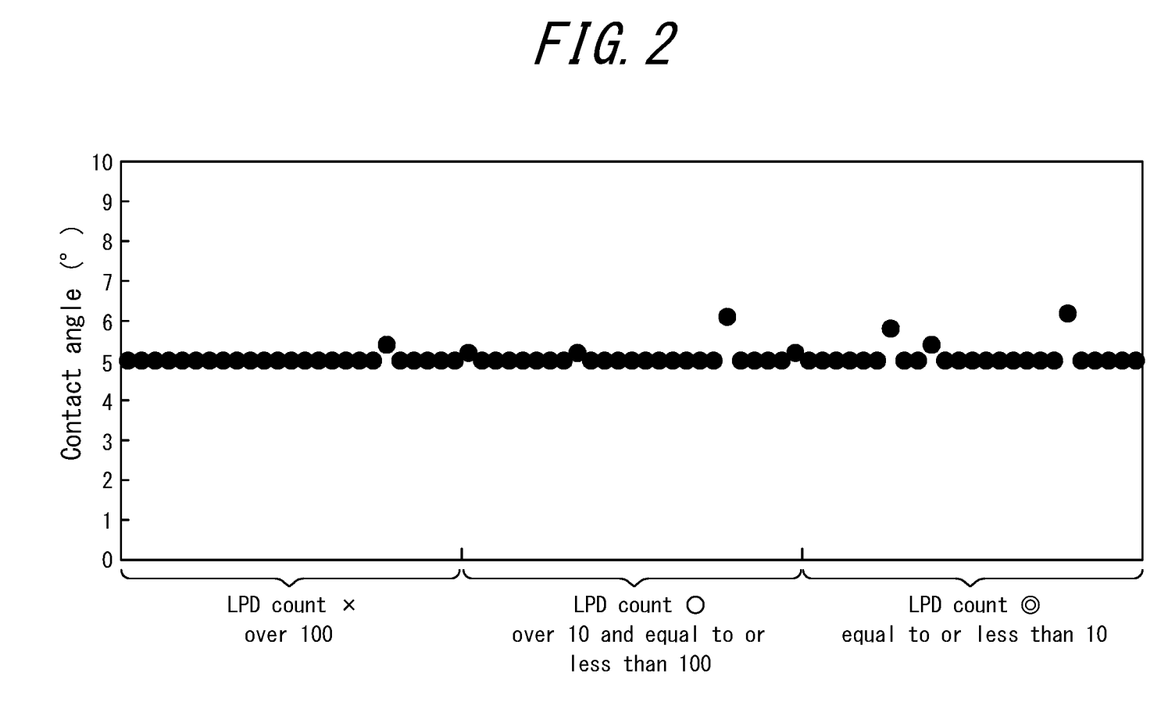
FIG. 2 is a graph illustrating the relationship between the LPD count after single-wafer spin cleaning and the contact angle of the wafer surface measured with pure water before single-wafer spin cleaning in Experimental Example 1.

FIG. 2 illustrates the measured contact angle at 25 points on the surface of each silicon wafer. As is clear from FIG. 2, the contact angles of the wafer surfaces measured with drops of pure water were 5° to 6° F. or all of the 3 silicon wafers with different levels of LPD counts. Therefore, the contact angle measurement with pure water could not detect the difference in surface conditions before single-wafer spin cleaning among wafers with different LPD counts.

Experimental Example 2

After mirror polishing, wafers were subjected to a pre-cleaning step of cleaning the wafers using a combination of an SC1 cleaning tank, an HF tank, an ozone tank, and the like and then rinsing the wafers with pure water and subsequently drying the wafers. Seven single crystal silicon wafers (300 mm diameter) were thus prepared. It is thought that since drying after the pre-cleaning step was insufficient, water vapor was generated in the FOUP and adsorbed on the wafer surface, resulting in polarization of water molecules on the wafer surface for the 7 silicon wafers.

Pretreatment was performed on the 7 silicon wafers by exposing the surface of the silicon wafers to downflow in a clean room. Pretreatment conditions (fan speed and standby time) are listed in Table 1, Nos. 1 to 7.

The contact angle of the surface of each silicon wafer was measured by the θ/2 method under the following conditions. The 3 conditions below were used as the set droplet volume, and the actual droplet volume that was dripped was measured from images of the droplets.
Apparatus: PCA-11 portable contact angle meter manufactured by Kyowa Interface Science Co., Ltd.
Type of dripped liquid: 20 mass % NaCl aqueous solution
Set droplet volume: 3 conditions of 0.5 μL, 1.0 μL, 2.0 μL
Measurement points: 5 points on wafer surface (1 cm to 2 cm intervals from the center to the edge)

Figure 3:
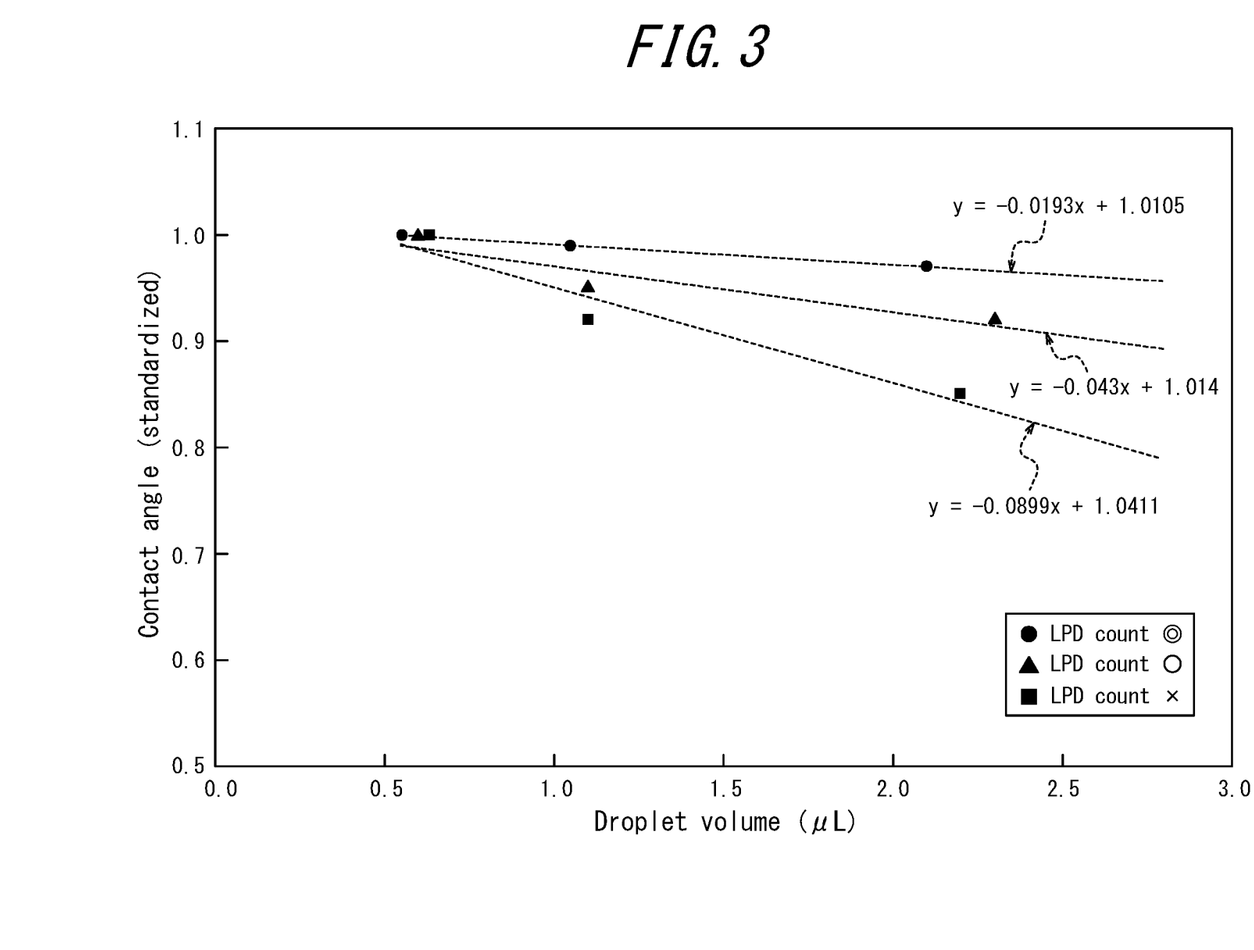
FIG. 3 is a graph illustrating the results of contact angle measurement when measuring with a NaCl solution in Experimental Example 2.

The average of the measured contact angle values (average of 5 points) was calculated for each set droplet volume, and the average of the measured values for each set droplet volume was standardized with the largest average value as 1. The measured data were plotted on a plane with the measured droplet volume (average of 5 points) as the horizontal axis and the standardized contact angle (average of 5 points) as the vertical axis, and the slope of the line was calculated by linear approximation using the least squares method. FIG. 3 illustrates the plots and approximate lines for Nos. 1, 2, 4 as representative examples among Nos. 1 to 7. Table 1 illustrates the absolute value of the slope for Nos. 1 to 7.

Figure 4:
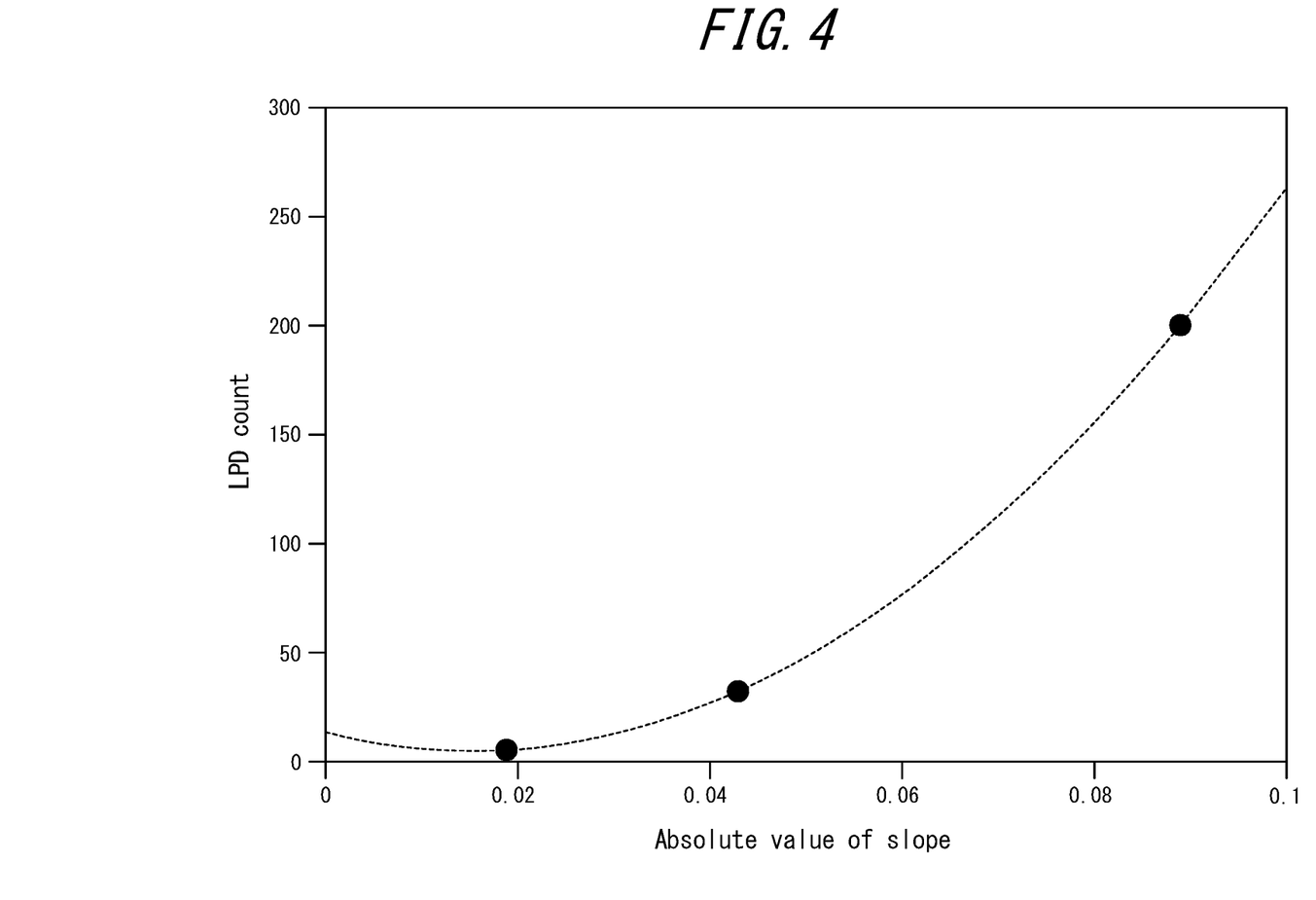
FIG. 4 is a graph illustrating the relationship between the absolute value of the slope of the line in FIG. 3 and the LPD count after single-wafer spin cleaning.

Subsequently, for each silicon wafer, single-wafer spin cleaning was performed by first performing spin cleaning with ozone water, followed by 3 sets of a combination of spin cleaning with hydrofluoric acid and subsequent spin cleaning with ozone water. Finally, spin drying was performed at a wafer rotation speed of 1500 rpm.
Conditions for spin cleaning with ozone water
    Concentration: 25 mg/L
    Flow rate: 1.0 L/min
    Process time per cleaning: 200 seconds
    Wafer rotation speed: 500 rpm
Conditions for single-wafer spin cleaning with hydrofluoric acid
    Concentration: 1 mass %
    Flow rate: 1.0 L/min
    Process time per cleaning: 50 seconds
    Wafer rotation speed: 500 rpm The surface of each silicon wafer was then measured using a laser particle counter (manufactured by KLA-Tencor, Surfscan SP7) in high sensitivity (HS) mode to determine the number of LPDs 15 nm or greater in size. Table 1 lists the results. The criteria for determining the LPD count were as follows. FIG. 4 illustrates the relationship between the absolute value of the slope of the line in FIG. 3 and the LPD count after single-wafer spin cleaning.
⊚: equal to or less than 10
O: over 10 and equal to or less than 100
X: over 100

TABLE 1

| No. | Pretreatment conditions | | Absolute value of slope of standardized contact angle/droplet volume | LPD | |
| | Fan speed (rpm) | Standby time (seconds) | | Count | Determination |
| --- | --- | --- | --- | --- | --- |
| 1 | not performed | | 0.089 | 200 | X |
| 2 | 1300 | 60 | 0.043 | 32 | O |
| 3 | 1300 | 120 | 0.020 | 8 | |
| 4 | 1300 | 300 | 0.019 | 5 | |
| 5 | 1000 | 60 | 0.049 | 75 | O |
| 6 | 1300 | 60 | 0.040 | 26 | O |
| 7 | 1600 | 60 | 0.020 | 9 | |

As is clear from Table 1 and FIGS. 3 and 4, the LPD count was determined to be O in a case in which the absolute value of the slope of the standardized contact angle/droplet volume was 0.050 or less, whereas the LPD count was determined to be ⊚ in a case in which the absolute value of the slope of the standardized contact angle/droplet volume was 0.020 or less. A correlation thus exists between the absolute value of the slope of the standardized contact angle/droplet volume and the LPD count. It is therefore clearly effective to determine whether pretreatment is necessary for any silicon wafer based on the absolute value of the slope as follows: in a case in which the absolute value of the slope is, for example, 0.050 or less, or 0.020 or less, single-wafer spin cleaning is performed without pretreatment, whereas in a case in which the absolute value of the slope is, for example, over 0.050 or over 0.020, single-wafer spin cleaning is performed after pretreatment.

Experimental Example 3

After mirror polishing, wafers were subjected to a pre-cleaning step of cleaning the wafers using a combination of an SC1 cleaning tank, an HF tank, an ozone tank, and the like and then rinsing the wafers with pure water and subsequently drying the wafers. Two single crystal silicon wafers (300 mm diameter) were thus prepared. Three weeks or more had passed for the 2 silicon wafers after the aforementioned pre-cleaning step, and minor deposition of organic matter was thought to have occurred on the wafer surface.

As illustrated in Table 2, between the 2 silicon wafers, pretreatment was not performed on one, whereas pretreatment was performed on the other by immersion for 5 seconds in ozone water with a concentration of 25 mg/L. The contact angle of the surface of each silicon wafer was then measured using the same method as in Experimental Example 2, and the absolute value of the slope of the standardized contact angle/droplet volume was calculated. Subsequently, single-wafer spin cleaning and spin drying were performed on each silicon wafer under the same conditions as in Experimental Example 2, and the LPD count was measured using the same method as in Experimental Example 2. Table 2 lists the results.

TABLE 2

| No. | Pretreatment condition Ozone dip treatment | Absolute value of slope of standardized contact angle/droplet volume | LPD Count | LPD Determination |
|---|---|---|---|---|
| 1 | not performed | 0.124 | 200 | X |
| 2 | 5 seconds | 0.018 | 5 |  |

Experimental Example 4

After mirror polishing, wafers were subjected to a pre-cleaning step of cleaning the wafers using a combination of an SC1 cleaning tank, an HF tank, an ozone tank, and the like and then rinsing the wafers with pure water and subsequently drying the wafers. Two single crystal silicon wafers (300 mm diameter) were thus prepared. It is thought that since drying after the pre-cleaning step was insufficient, water vapor was generated in the FOUP and adsorbed on the wafer surface, resulting in polarization of water molecules on the wafer surface for the 2 silicon wafers.

As illustrated in Table 3, between the 2 silicon wafers, pretreatment was not performed on one, whereas pretreatment was performed on the other by irradiation with infrared light for 300 seconds. The contact angle of the surface of each silicon wafer was then measured using the same method as in Experimental Example 2, and the absolute value of the slope of the standardized contact angle/droplet volume was calculated. Subsequently, single-wafer spin cleaning and spin drying were performed on each silicon wafer under the same conditions as in Experimental Example 2, and the LPD count was measured using the same method as in Experimental Example 2. Table 3 lists the results.

TABLE 3

| No. | Pretreatment condition Infrared light irradiation | Absolute value of slope of standardized contact angle/droplet volume | LPD Count | LPD Determination |
|---|---|---|---|---|
| 1 | not performed | 0.070 | 230 | X |
| 2 | 300 seconds | 0.018 | 5 |  |

INDUSTRIAL APPLICABILITY

According to the method of cleaning a semiconductor wafer and the method of manufacturing a semiconductor wafer of the present disclosure, the LPD count on the wafer surface can be reliably reduced.

The invention claimed is:
1. A method of cleaning a semiconductor wafer, the method comprising:
   a first step of measuring a contact angle of a surface of a semiconductor wafer using a droplet dripped on the surface of the semiconductor wafer under a plurality of conditions in which a volume of the droplet dripped on the surface differs;

a second step of, based on a relationship between measured values of the volume of the droplet and measured values of the contact angle under the plurality of conditions, calculating a ratio of change in the measured values of the contact angle to change in the measured values of the volume of the droplet;

a third step of determining whether pretreatment is necessary for the surface of the semiconductor wafer based on the ratio;

a fourth step of performing the pretreatment on the surface of the semiconductor wafer according to the determining in the third step; and a fifth step of subsequently performing single-wafer spin cleaning on the surface of the semiconductor wafer.

2. The method of cleaning a semiconductor wafer according to claim 1, wherein after the first step and before the second step, a relative value of each of the measured values of the contact angle under the plurality of conditions is calculated, and in the second step, based on a relationship between the measured values of the volume of the droplet and the relative values of the measured values of the contact angle under the plurality of conditions, a ratio of change in the relative values of the measured values of the contact angle to change in the volumes of the droplet is calculated.

3. The method of cleaning a semiconductor wafer according to claim 2, wherein each of the relative values is a value standardized based on measured value of the contact angle under any one condition among the plurality of conditions.

4. The method of cleaning a semiconductor wafer according to claim 3, wherein the any one condition is a condition that maximizes measured value of the contact angle.

5. The method of cleaning a semiconductor wafer according to claim 1, wherein in the second step, a slope of a line obtained by applying a least squares method to the relationship is used as the ratio.

6. The method of cleaning a semiconductor wafer according to claim 1, wherein the plurality of conditions comprises 3 or more conditions.

7. The method of cleaning a semiconductor wafer according to claim 1, wherein in the first step, an image of the droplet dripped on the surface of the semiconductor wafer is acquired, and both the contact angle and the volume of the droplet are measured from the image.

8. The method of cleaning a semiconductor wafer according to claim 1, wherein the droplet is composed of an aqueous solution having a surface tension greater than a surface tension of pure water.

9. The method of cleaning a semiconductor wafer according to claim 8, wherein the aqueous solution is at least one selected from the group consisting of a sodium chloride solution, a potassium chloride solution, and a magnesium chloride solution.

10. The method of cleaning a semiconductor wafer according to claim 9, wherein the aqueous solution has a concentration of 10 mass % or more.

11. The method of cleaning a semiconductor wafer according to claim 1, wherein the volume of the droplet is set within a range of 0.3 µL to 3.0 µL.

12. The method of cleaning a semiconductor wafer according to claim 1, wherein in the third step, it is determined that the pretreatment is unnecessary in a case in which an absolute value of the ratio is equal to or less than a predetermined threshold, and it is determined that the pretreatment is necessary in a case in which the absolute value of the ratio exceeds the threshold.

13. The method of cleaning a semiconductor wafer according to claim 12, wherein the predetermined threshold is 0.050.

14. The method of cleaning a semiconductor wafer according to claim 12, wherein the predetermined threshold is 0.020.

15. The method of cleaning a semiconductor wafer according to claim 1, wherein the pretreatment includes one or more of (i) immersing the semiconductor wafer in ozone water, (ii) exposing the surface of the semiconductor wafer to downflow in a clean room, and (iii) irradiating the surface of the semiconductor wafer with infrared light.

16. The method of cleaning a semiconductor wafer according to claim 1, wherein in a case of performing the pretreatment in the fourth step, the first step through the third step are repeated thereafter, and the fifth step is performed after it is determined that the pretreatment is not necessary again.

17. The method of cleaning a semiconductor wafer according to claim 1, wherein in the fifth step, spin cleaning with ozone water is performed first, followed by one or more sets of a combination of spin cleaning with hydrofluoric acid and subsequent spin cleaning with ozone water.

18. The method of cleaning a semiconductor wafer according to claim 1, wherein the semiconductor wafer is a silicon wafer.

19. A method of manufacturing a semiconductor wafer, the method comprising the method of cleaning a semiconductor wafer according to claim 1.

* * * * *